United States Patent [19]

Shimoda et al.

[11] Patent Number: 4,566,054
[45] Date of Patent: Jan. 21, 1986

[54] RACK FOR MOUNTING TWO ELECTRONIC DEVICES CONNECTABLE TO AND DISCONNECTABLE FROM EACH OTHER

[75] Inventors: Mituhiko Shimoda; Masahiro Koinuma; Yoshitaka Ohta, all of Tokyo, Japan

[73] Assignee: Asahi Kogaku Kogyo Kabushiki Kaisha, Tokyo, Japan

[21] Appl. No.: 631,733

[22] Filed: Jul. 17, 1984

[30] Foreign Application Priority Data

Jul. 20, 1983 [JP]  Japan .......................... 58-111503[U]

[51] Int. Cl.[4] .............................................. H05K 7/00
[52] U.S. Cl. .................................... 361/422; 361/338; 361/420; 361/428; 339/75 R; 211/26
[58] Field of Search ........................ 339/75 R, 75 M; 361/331, 338, 342, 380, 390, 391, 393, 394, 417–420, 422, 426, 428, 429, 332; 312/233, 7.1; 248/174; 211/26, 41

[56] References Cited

U.S. PATENT DOCUMENTS

| | | | |
|---|---|---|---|
| 2,021,111 | 11/1935 | Wheat | 339/75 R |
| 3,170,091 | 2/1965 | Hudson | 361/338 |
| 3,717,805 | 2/1973 | Gnaedinger | 361/338 |
| 3,963,296 | 6/1976 | Glover | 339/75 M |
| 4,249,227 | 2/1981 | Kato | 361/338 |
| 4,310,870 | 1/1982 | Kia | 361/391 |
| 4,367,513 | 1/1983 | Cronin | 361/428 |

*Primary Examiner*—G. P. Tolin
*Attorney, Agent, or Firm*—Fleit, Jacobson, Cohn & Price

[57] ABSTRACT

Electronic equipment rack having a first and a second mount to hold respectively a first and a second electronic device, characterized in that the connector of a connecting cord for the first electronic device can be detachably fitted to the second mount through a connector-holder, thereby permitting the connector of the connecting cord for any commercial electronic device to be readily fitted to the second mount; and that the second electronic device as fitted to the second mount can be moved by pushing or pulling, thereby permitting the connector of the second electronic device to be connected to or disconnected from said connector of said connecting cord for said first electronic device.

4 Claims, 7 Drawing Figures

RACK FOR MOUNTING TWO ELECTRONIC DEVICES CONNECTABLE TO AND DISCONNECTABLE FROM EACH OTHER

FIELD OF THE INVENTION

The present invention relates to an electronic equipment rack which facilitates mutual connection of electronic devices such as a home-use portable video record player or an audio device.

BACKGROUND OF THE INVENTION

Usually a home-use portable video record player consists of two detachable components, that is a small-size video tape recorder (VTR) and a tuner. Outdoor video recording is done using such a VTR and a video camera and thereby the VTR must be separated from the tuner. For playing the video record after recording, the VTR must be connected again to the tuner. And such VTR disconnection-reconnection must take place frequently. It is desirable that this disconnection-reconnection operation be simplified.

The connecting cord which connects the VTR to the tuner is designed short to avoid noise influence and accordingly said cord lacks freedom. Meanwhile the connector attached to the end of said connecting cord is designed so directional that it can be connected to the VTR only in a preset direction. Besides the VTR connection terminal is located on the back side and accordingly connection of said connector to the rack holding the VTR has to be done manually in a narrow space between the rack and the VTR. Thus this operation of connecting the connector to the VTR connection terminal is not easy and takes much time.

SUMMARY OF THE INVENTION

A first object of the present invention is to provide an electronic equipment rack having a first and a second mount to hold respectively a first and a second electronic device, characterized in that the connector of a connecting cord for the first electronic device can be detachably fitted to a specified position of the second mount and the second electronic device as fitted to the second mount can be moved, thereby making it possible to simply connect to or disconnect from the connector of the first electronic device the connector of the second electronic device.

A second object of the invention is to provide an electronic equipment rack which permits the connector of the connecting cord of the first electronic device to be readily fitted to the second mount.

A third object of the invention is to provide an electronic equipment rack characterized in that there is no possibility of a mounted electronic device inadvertently flying sideways out of the mount and that the connector of the second electronic device can be easily connected to or disconnected from the connector of the first electronic device by merely shifting the second electronic device in longitudinal direction.

A fourth object of the invention is to provide an electronic equipment rack characterized in that when the connector of the second electronic divice is disconnected from the connector of the first electronic device, the connector of the first electronic device can follow a possible tilting due to a forward lifting of the second electronic device, thus preventing the connectors from being broken.

A fifth object of the invention is to provide an electronic equipment rack characterized in that the second electronic device can be smoothly brought up to or away from the connector of the second mount.

A sixth object of the invention is to provide an electronic equipment rack characterized by an increased rigidity of a pair of side plates which serve to suppress a lateral displacement of the electronic devices on the mount. A seventh object of the invention is to provide an electronic equipment rack characherized by provision on the mount of side plates which restrict the displacement of the electronic devices, said side plates facilitating the operation of the electronic devices on the mount.

An eighth object of the invention is to provide an electronic equipment rack characterized in that the second electronic device to be connected to or disconnected from the first electronic device can be easily put on or off a specified position of the mount.

A ninth object of the invention is to provide an electronic equipment rack characterized in that the connecting cord does not hinder the mounting of the electronic devices nor does it mar the external appearance of the equipment.

A tenth object of the invention is to provide an electronic equipment rack which permits easy installation of the connecting cord within the wiring space.

An eleventh object of the invention is to provide an electronic equipment rack charactirized in that the connector of the connecting cord does not hinder the mounting of an electronilc device on the second mount.

A twelfth object of the invention is to provide an electronic equipment rack which permits adjustment of the connector fitting position.

These and other objects, advantages, features and uses will become more apparent as the description proceeds, when considered with the accompanying drawings.

BRIEF DESCRIPTION OF THE DRAWINGS

FIG. 5 is an exploded oblique view of another example of the connector holder to be used in the present invention.

DETAILED DESCRIPTION OF THE INVENTION

Figure 1:
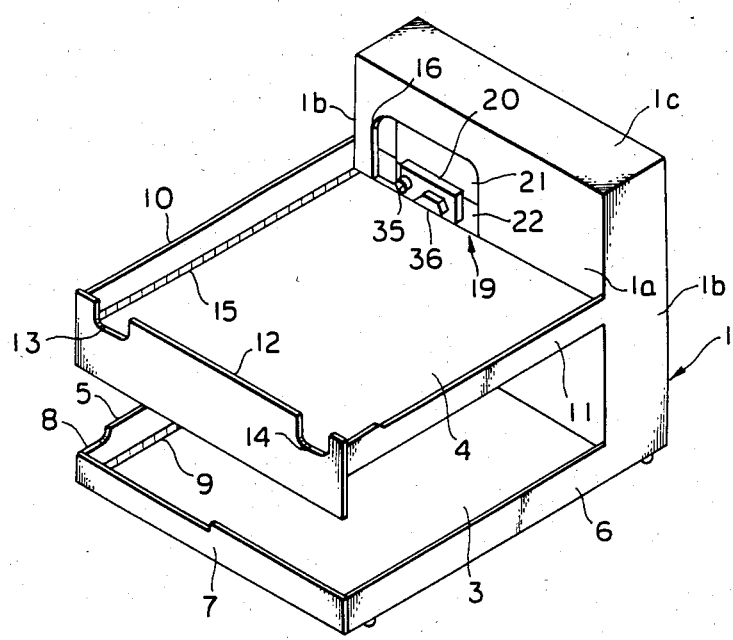
FIG. 1 is an oblique view of an electronic equipment rack according to the present invention.

The present invention is here described referring to the drawings.

A rack body 1 in FIG. 1 comprises a front wall 1a, a side wall 1b and a top wall 1c. These walls 1a–1c enclose a wiring space 2 indicated in FIG. 4.

At the front base of the front wall 1a of the rack body 1, there is integrally provided a first shelf 3 as the first mount; and at the top side of the rack body 1, i.e., at the mid-front of the front wall 1a there is integrally provided a second shelf for VTR as the second mount.

Figure 2:
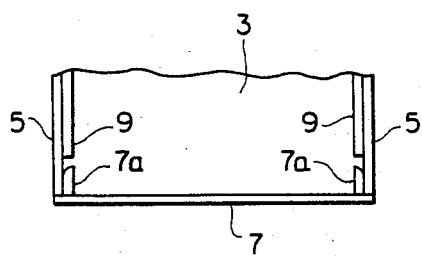
FIG. 2 is a partial plan view of the lower shelf in the electronic equipment rack illustrated in FIG. 1.

On both sides of the shelf 3 there are side plates 5, 6 projecting upward opposite to each other with a specified spacing, and inside of these side plates 5, 6 there are stretched spings 7a, 7a on both sides of a front side plate 7 as illustrated in FIG. 2. Said front side plate 7 is thus detachably fitted to the shelf 3 and to the forward ends of the side plates 5, 6. Said side plates 5, 7 have a notch 8 formed therein. Said notch 8 serves to prevent the lid of the timer-manipulator provied on tuner from hitting the front side plate 7 when said lid is opened or shut, and to facilitate operation of said timer-manipulator. Further on both sides of the shelf 3 there are fitted guide rails 9, 9 extending along the side plates 5, 6.

Figure 3:
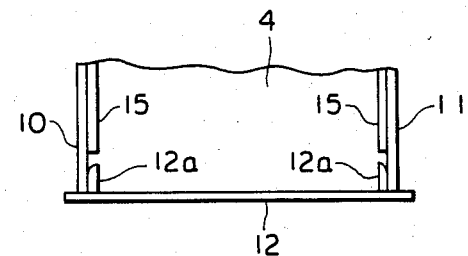
FIG. 3 is a partial plan view of the upper shelf in the electronic equipment rack illustrated in FIG. 1.

On both sides of the shelf 4, spaced side plates 10, 11 project upward opposed to each other. Inside of said side plates 10, 11 there are as illustrated in FIG. 3 springs 12a, 12a, stretched on both sides of said side plate 12. Thus the front side plate 12 is detachably fitted to the shelf 4 and to the forward ends of the side plates 10, 11. Morever at the left end of the front side plate 12 is formed a notch 13 to facilitate manipulation of the dial for VTR tracking control, while at the right end of the front side plate 12 is formed a notch 14 to facilitate manipulation of the knob for VTR speed change. Further on both sides of the shelf 4 there are fitted guide rails 15, 15 extending longitudinally along the side plates 10, 11. As indecated in FIG. 4 an opening 16 extends vertically in the front wall 1a of the rack body 1. Said opening 16 extends over the second shelf 4 in vertical direction. Behind the shelf 4 there is provided a fixture 4a to fit or mount the connector holder. Said fixture 4a has slots 17 extending in lateral direction. Said fixture 4a runs through the opening 16 into the wiring space 2.

Figure 5:
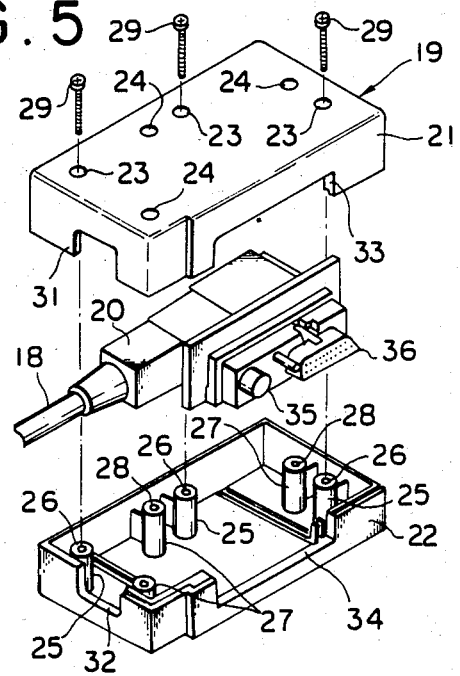
FIG. 5 is an exploded oblique view of the connector holder illustrated in FIGS. 1 and 4.

18 is a connecting cord one end of which is connected to a tuner (not shown). 19 is a connector holder designed as a casing. 20 is a connector fitted to the other end of the connecting cord 18. As illustrated in FIG. 5, said connector holder 19 is equipped with split hold pieces 21, 22.

Figure 4:
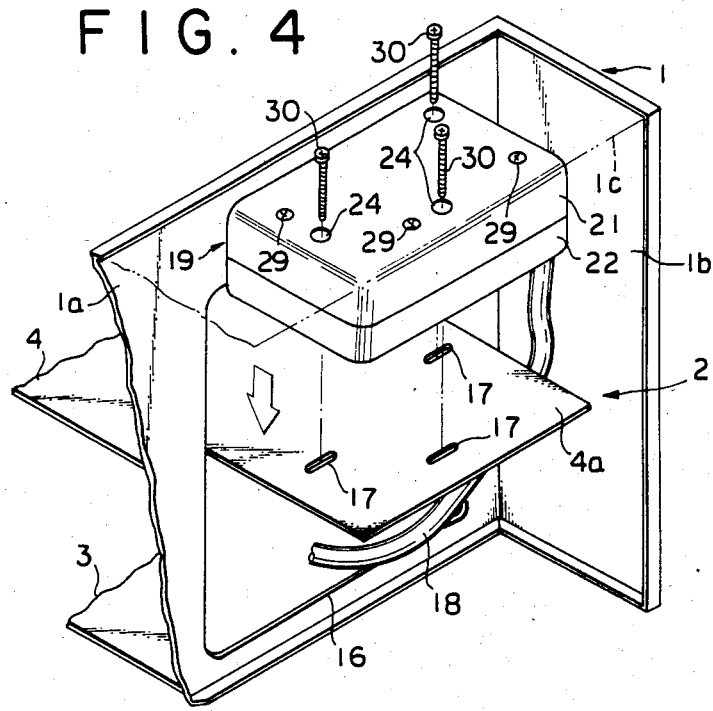
FIG. 4 is an oblique view from the rear top of a partly broken rack of FIG. 1.

Said split hold piece 21 has holes 23 to receive each a coupling screw and holes 24 to receive each a fixing screw. The stems 25 projecting within the split hold piece 22 have a screw hole 26, and the stems 27 projecting within the split hold piece 22 have a hole 28 to receive a connector-fixing screw. These split hold pieces 21, 22 can be integrated as illustrated in FIGS. 1 and 4 by screwing the coupling screws 29 into the screw holes 26 after passing them through the holes 23. The split hold pieces 21, 22 thus integrated can be fitted to the fixture 4a as illustrated in FIG. 1 by screwing a nut (not shown) to the tip of the fixing screw 30 after passing the fixing screw 30 through the holes 24, 28 and the slot 17. Said split hold pieces 21, 22 have respectively notches 31, 32 for cord insertion as well as notches 33, 34 for passage of connector projections.

On the side surface of the connector 20 there are the RF signal connector projection 35 and the video signal connector projection 36. These two projections 35, 36, as seen in FIG. 1, jut out through the opening 16 to the top side of the shelf 4 and they are located sidewise.

Next the action of the electoronic equipment rack thus constituted and its installing conditions are to be described.

When the tuner is to be set on the shelf 3, first the front side plate 7 is taken off the shelf 3 and then the rear side of the tuner is inserted between the side plates 5, 6 and placed on the shelf 3.

In this state of the rear end of the tuner being restricted in its a displacement by the side plates 5, 6, the tuner is not likely to fly out sideways inadvertently. Morever, if a small gap is provided between the tuner and the side plates 5, 6 so that the tuner may not get off the guide rails 9, 9, the rear end of the tuner will be held securely on the guide rails 9, 9. When in this state the tuner is pushed backward to the side of the rack body 1, the tuner will smoothly slide along the guide rails 9, 9 to the side of the rack body 1.

Once the rear end of the tuner has reached the front wall 1a of the rack body 1, the front side plate 7 can be attached to the forward end of the shelf 3. The connecting cord 18, one end of which is usually fixedly connected to the tuner, may be detachably connected to the tuner.

When the VTR is to be set on the shelf 4, first the front side plate 12 is taken off the shelf 4 and then the rear side of the VTR is inserted btween the side plates 10, 11 and placed on the shelf 4. In this state of the rear end of the VTR being restricted in its displacement by the side plates 10, 11, the VTR is not likely to fly out sideways inadvertently. If morever a small gap is provided between the VTR and the side plates 10, 11 so that the VTR may not get off the guide rails 15, 15 the rear end of the VTR will securely rest on the guide rails 15, 15. When in this state the VTR is pushed back toward the rack body 1, the VTR will smoothly slide along the guide rails 15, 15 toward the rack body 1. When the VTR, the rear end of which comes close to the front wall 1a of the rack body, is pushed farther back, the connector (not shown) behind the VTR gets securely connected to the projections 35, 36 of the connector 20.

Then the front side plate 12 can be attached to the forward end of the shelf 4.

Adjustments of the tunner and the VTR thus connected are done through the notches 8, 13, 14. The user can easily disconnect the connector 20 by merely pulling it.

In the example illustrated above, the tuner is set on the shelf 3, but the user may set the power source for VTR instead of the tuner and fit the connector connected to the power source for VTR to the connector fixture 4a. In said example the tuner is set on the lower shelf 3 and the VTR on the upper shelf 4, but this arrangement is not mandatory; the tuner may be set the upper shelf 4 and the VTR on the lower shelf 3 with the connector 20 fitted to the shelf 3, or both the VTR and the tuner may be set on the same shelf.

Figure 6:
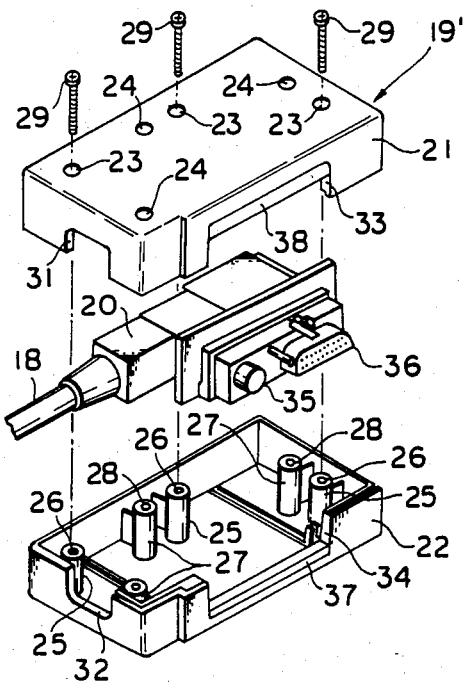
Figure 7:
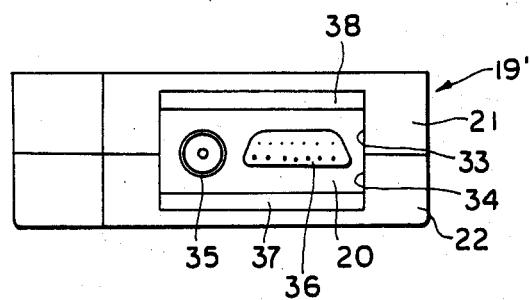
FIG. 7 is an elevation view of the connector holder as an assembly of the parts shown in FIG. 6.

FIGS. 6 and 7 illustrate another example of the connector holder for this invention. The connector holder 19' comprises elastic pieces 37, 38. This holder 19' is otherwise similar to the holder 19 previously described. The elastic pieces 37, 38 are bonded in the respective bottoms of the notches 33, 34 as shown. Said elastic pieces are made of rubler or synthetic resin.

The connecting side of the connector 20 is set, as shown in FIG. 7, between the notches 33, 34 of the split hold pieces 21, 22 so that said connecting side of the connector 20 may be squeezed between said elastic pieces 37 and 38, thereby avoiding looseness in the connecting side of the connector 20. The part of the connector 20 to be held in the connector holder 19' is designed to permit slight vertical displacement and rotation of the connector in the holder.

In such an arrangement the connecting projections 35, 36, when subjected to vertical fores acting thereon, will slightly tilt or simply desplace in vertical direction compressing the elastic pieces 37, 38. Thus, when the second electronic device directly connected to the connector 20 is disconncted from the connector 20, the projections 35, 36 will follow the movement of said electronic device which may be lifted forward and tilted, thereby preventing said projections 35, 36 from being damaged.

As explained above, the electronic equipment rack according to the present invention is provided with the first mount for the first electronic device which has a connecting cord whose free end is provided with a connector, and the second mount for the second electronic device which has a connector to be connected to the connector of the first electronic device; and there is a connector holder provided on the second mount. Said connector holder makes it possible to connect or disconnect said connector to and from the second mount. Therefore the connector of the connecting cord of any commercial electronic device can be attached to the second mount by means of said connector holder. Thus the electronic equipment rack according to the present invention, which is applicable for any commercial electronic device, is universally available.

Moreover, when the second electronic device mounted on the second mount is pushed and shifted to the connector side, the connector of the first electronic device can be connected to the connector of the second electronic device; and when said second electronic device mounted on the second mount is pulled and shifted away from the connector side, said two connectors can be easily disconnected.

Morever, when the connector holder is composed of a pair of split hold pieces which can be mutually coupled or decoupled and the connector is squeezed between said split hold pieces so that the connector may be detachably fitted to the second mount, it will be possible to simply fit the connector of the connecting cord to the second mount.

Further, when side plates are provided on each mount, with a spacing slightly larger than the width of the electronic device and the connector is fitted to the rear end of the second mount, with its connecting side held forward by the connector holder, the electronic device held on the mount is not likely to fly out sideways inadvertently and the connectors can be easily connected or disconnected by merely shifting the second electronic device in longitudinal direction.

Furthermore, when elastic pieces are interposed between the connector and the connector holder to make the connecting side of the connector displaceable in vertical direction, the connector of the first electronic device will be able to follow the movement of the second electronic device, which may be lifted forward and tilted when the connector of said second electronic device is separated from the connector of the first electronic device; thus damage to the connectors and their vicinity due to tilting of the electronic divice can be prevented.

Furthermore, when a pair of longitudinal guide rails are laid along the side plates on the mount, it will be possible to make smooth the movement of the second electronic device relative to the connector of the second mount.

Furthermore, when a front side plate is detachably provided between the forward ends of the paired side plates on each mount, the side plates can be made more rigid.

Furthermore, when a notch opposite to the manipulating part of the electronic device on the mount is provided on the side plate, the manipulation of the electronic device on the mount will be facilitated.

Furthermore, when the first shelf, that is the first mount is integrated to the front base of the vertically extending rack body and the second shelf, that is the second mount is integrated to the front top of said rack body, it will become easy to set the second electronic device at a specified position relative to the first electronic device or to set the second electronic device off the first electronic device.

Furthermore, when a wiring space is provided within the rack body and the connecting cord is housed within said space, the connecting cord can be prevented from hindering the mounting of the electronic device or from marring the external appearance of equipment.

Furthermore, when an opening on the front wall of the rack body is formed vertically extending over the second shelf, the connecting cord of the first electronic device set on the first shelf is stretched from below through said opening into said wiring space and the connector of said connecting cord is fitted, opposite to the top side of said opening, to the rear end of the second shelf by means of the connector holder, the disposition of the connecting cord in said wriring space will be facilitated.

Furthermore, when a connector holder fixture jutting into the wriring space through said opening is provided at the rear end of the second shelf, a connector holder is fitted to said fixture and the projection of the connector attached to said fixture by means of said connector holder juts out beyond the front of the rack body, the connector of the connecting cord will be prevented from hindering the mounting of an electronic device to the second mount.

Furthermore, when sidewise extending slots are provieded in said fixture and the connector holder is fitted to said fixture by means of screws running through said slots, the connector fitting position will be easily adjustable.

What is claimed is:

1. A rack for mounting two electronic devices connectable to and disconnectable from each other, which rack comprises:
   (a) a rack body vertically extending and having a wiring space inside thereof;
   (b) a first mount shelf for mounting a first electronic device, said first mount shelf being integrally provided with a lower portion of a front wall of the rack body;
   (c) a second mount shelf for mounting a second electronic device, said second mount shelf being integrally provided with an upper portion of the front wall of the rack body;
   (d) an opening formed in the front wall of the rack body, said opening bridging an upper portion and a lower portion of the second mount shelf;
   (e) side plates upwardly projected at both sides of each of the mount shelves;
   (f) a front side plate detachably attached between front ends of the side plates of each of the mount shelves;
   (g) a fixture for mounting a connector holder, said fixture being provided at a rear end of the second mount shelf and projecting into said wiring space from said opening in the front wall of the rack body; and (h) the connector holder being mounted on the fixture and having means for positional adjustment in right and left directions with respect to the front wall of the rack body and having means for holding a connector of a connection cord of the first electronic device mounted on the first mount shelf in such a manner that a connecting projection of the connector may project forwardly from the front wall of the rack body.

2. A rack for mounting two electronic devices connectable to and disconnectable from each other according to claim 1, wherein said connector holder is constituted by a pair of split hold pieces which are split essentially centrally and detachably coupled with each other, a pair of notches for the insertion of the connecting projection of the connector are correspondingly formed in the pair of the split hold pieces, elastic pieces are bonded and fixed to bottom portions of the respective notches, and a connecting side of said connector is interposed between the elastic pieces in the pair of notches.

3. A rack for mounting two electronic devices connectable to and disconnectable from each other according to claim 1, wherein spring devices are provided on opposite inner side portions of each front side plate, and the front side plate is detachably attached between the front ends of the associated shelf side plates as a result of the spring devices being in slidable spring contact with inner surfaces of the side plates.

4. A rack for mounting two electronic devices connectable to and disconnectable from each other according to claim 1, wherein guide rails are provided on opposite side portions of each of the mount shelves and along the side plates.

* * * * *